United States Patent
Kim

(10) Patent No.: US 9,660,223 B2
(45) Date of Patent: May 23, 2017

(54) PRINTING APPARATUS

(71) Applicant: Samsung Display Co., Ltd., Yongin-si, Gyeonggi-do (KR)

(72) Inventor: Eui-Gyu Kim, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/186,830

(22) Filed: Jun. 20, 2016

(65) Prior Publication Data

US 2016/0293904 A1    Oct. 6, 2016

Related U.S. Application Data

(62) Division of application No. 14/041,534, filed on Sep. 30, 2013, now Pat. No. 9,397,295.

(30) Foreign Application Priority Data

May 27, 2013    (KR) ........................ 10-2013-0059793

(51) Int. Cl.
*H01L 51/56* (2006.01)
*H01L 51/00* (2006.01)
*G03F 7/20* (2006.01)

(52) U.S. Cl.
CPC .......... *H01L 51/56* (2013.01); *G03F 7/70691* (2013.01); *H01L 51/0005* (2013.01)

(58) Field of Classification Search
CPC .. H01L 51/56; H01L 51/0005; G03F 7/70691
See application file for complete search history.

(56) References Cited

U.S. PATENT DOCUMENTS

| | | | |
|---|---|---|---|
| 6,220,912 B1 | 4/2001 | Shigeoka et al. | |
| 8,242,492 B2 | 8/2012 | Kim | |
| 2004/0115338 A1 | 6/2004 | Yoneda | |
| 2012/0237679 A1* | 9/2012 | Madigan | C23C 14/042 427/248.1 |
| 2012/0268005 A1* | 10/2012 | Furihata | H01L 27/3283 313/504 |
| 2013/0240870 A1 | 9/2013 | Kawato et al. | |

FOREIGN PATENT DOCUMENTS

| | | | | |
|---|---|---|---|---|
| JP | 05-027225 | 2/1993 | | |
| JP | 2007-026684 | 2/2007 | | |
| KR | 1020100023898 A | * | 3/2010 | ............ H01L 51/56 |
| KR | 10-2011-0104793 | 9/2011 | | |

* cited by examiner

*Primary Examiner* — Kyoung Lee
*Assistant Examiner* — Christina Sylvia
(74) *Attorney, Agent, or Firm* — Knobbe Martens Olson & Bear LLP

(57) ABSTRACT

A printing apparatus includes a printing mask, which is disposed between a substrate having a display area and a non-display area surrounding the display area. The apparatus further includes a nozzle discharging an organic light emitting liquid onto the substrate. The printing mask includes a mask open part and a mask cover part. The mask open part exposes the display area, and the mask cover part surrounds the mask open part and covers the non-display area. The apparatus can be used to form an organic emitting layer on the substrate.

7 Claims, 4 Drawing Sheets

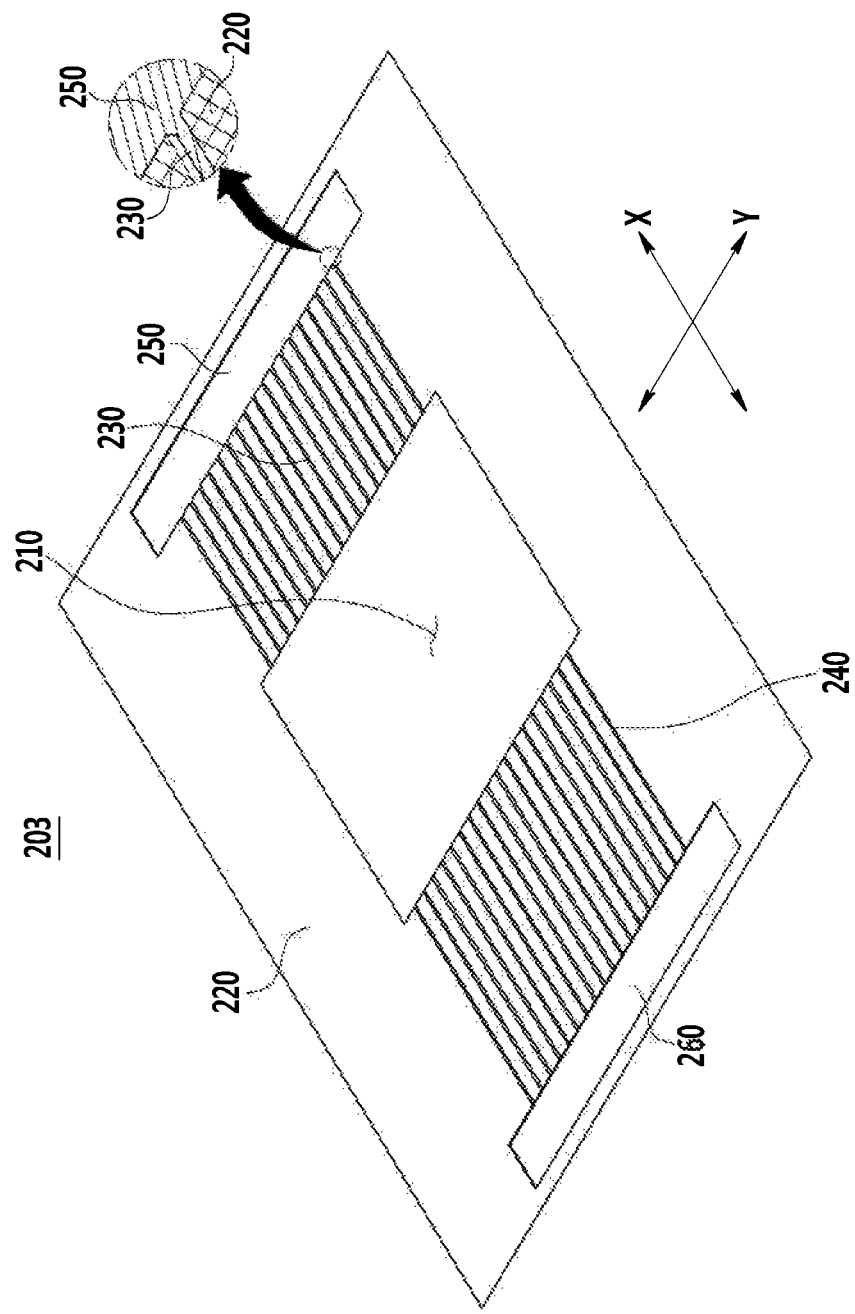

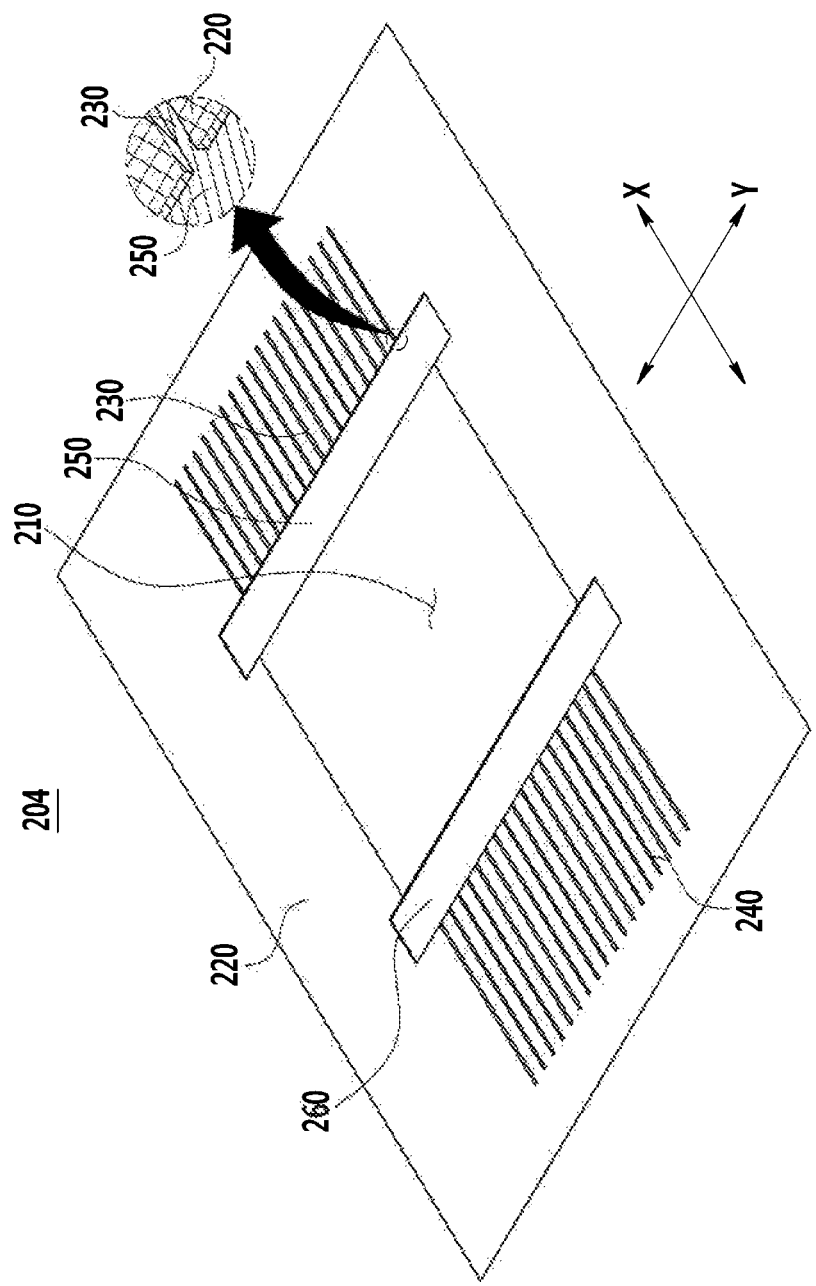

PRINTING APPARATUS

CROSS-REFERENCE TO RELATED APPLICATIONS

This application is a divisional of U.S. application Ser. No. 14/041,534, filed on Sep. 30, 2013, which claims priority to Korean Patent Application No. 10-2013-0059793 filed in the Korean Intellectual Property Office on May 27, 2013, the entire contents of which are incorporated herein by reference.

BACKGROUND

Field

The present disclosure relates to a printing apparatus and a method of forming an organic light emitting layer, which are used when the organic light emitting layer is formed on a substrate.

Description of the Related Technology

Display devices are those that display images, and an organic light emitting diode (OLED) display has recently been receiving attention.

The OLED display has self-luminance characteristics, and does not require a separate light source, unlike a liquid crystal display (LCD), and thus the thickness and weight thereof may be relatively decreased. In addition, the OLED display exhibits high-quality characteristics such as low consumption power, high brightness, high response speed, and the like.

Generally, the OLED display includes an organic light emitting element having a first electrode, an organic light emitting layer disposed on the first electrode, and a second electrode disposed on the organic light emitting layer.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

Embodiments of the present invention have been made in an effort to provide a printing mask and an apparatus for printing an organic light emitting layer, having advantages of not needing to remove an organic light emitting layer formed in a non-display area of a substrate through additional processes even when the organic light emitting layer is printed in a display area of the substrate using a nozzle.

One embodiment of the present invention provides a printing apparatus including a mask disposed between a substrate having a display area and a non-display area surrounding the display area, and a nozzle discharging an organic light emitting liquid onto the substrate. The printing mask includes a mask open part, and a mask cover part. The mask open part exposes the display area. The mask cover part surrounds the mask open part and covers the non-display area.

The nozzle may discharge the organic light emitting liquid while moving in a moving direction across the mask open part. The mask may further include at least one first groove located at one side of the mask cover part on a path in the moving direction. The at least one first groove may be dented from a surface of the mask cover part and extended along the moving direction.

The at least one first grove may be adjacent to the mask open part.

The mask may include a plurality of first grooves, and the plurality of first grooves may be spaced apart from each other in a crossing direction across the moving direction.

The printing apparatus may further include a first reservoir communicating with the plurality of first grooves. The first reservoir may be dented from the surface of the mask cover part and extended along the crossing direction The first reservoir may be located between the plurality of first grooves and an end portion of the mask cover part.

The first reservoir may be located between the plurality of first grooves and the mask open part.

The printing apparatus may further include at least one second groove located at the other side of the mask cover part, which is spaced apart from one side of the mask cover part with the mask open part therebetween on the path in the moving direction. The at least one second groove may be dented from the surface of the mask cover part and extended along the moving direction.

The at least one second groove may be adjacent to the mask open part.

The mask may include a plurality of second grooves, and the plurality of second grooves may be spaced apart from each other in a crossing direction across the moving direction.

The printing apparatus may further include a second reservoir communicating with the plurality of second grooves. The second reservoir may be dented from the surface of the mask cover part and extended along the crossing direction.

The second reservoir may be located between the plurality of second grooves and an end portion of the mask cover part.

The second reservoir may be located between the plurality of second grooves and the mask open part.

Another embodiment of the present invention provides a method of forming an organic light emitting layer on a substrate using the printing apparatus, the method comprising: printing an organic light emitting layer by discharging the organic light emitting liquid through the nozzle and onto the printing mask disposed between the substrate and the nozzle, such that the organic light emitting layer is formed on the display area of the substrate.

According embodiments of the present invention, there can be provided a printing mask and an apparatus for printing an organic light emitting layer, which do not need to remove an organic light emitting layer formed in a non-display area of a substrate through additional processes even when the organic light emitting layer is printed in a display area of the substrate using a nozzle.

BRIEF DESCRIPTION OF THE DRAWINGS

FIG. 3 shows a printing mask according to a third embodiment of the present invention.

FIG. 4 shows a printing mask according to a fourth embodiment of the present invention.

DETAILED DESCRIPTION OF CERTAIN INVENTIVE EMBODIMENTS

Figure 1:
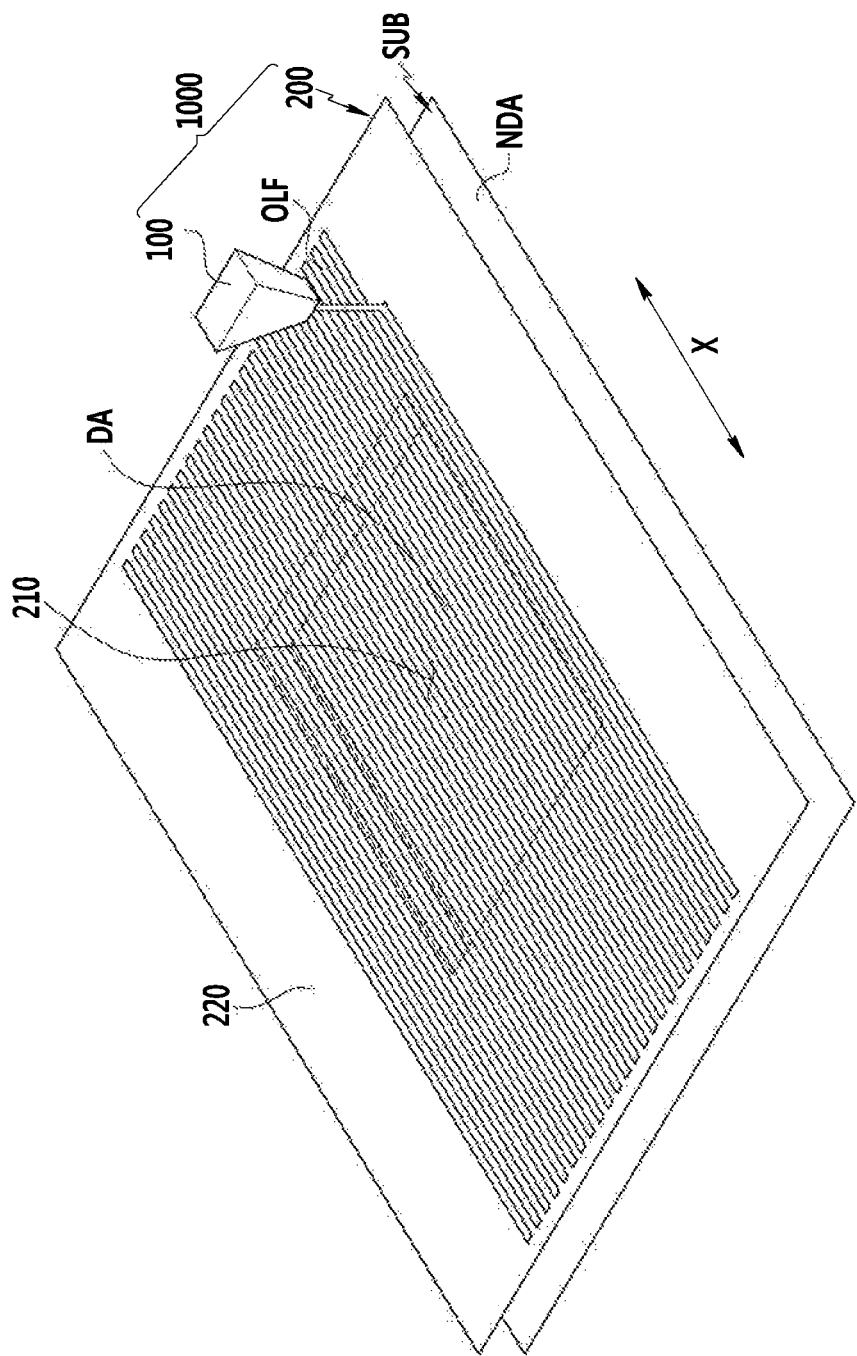
FIG. 1 shows an apparatus for printing an organic light emitting layer according to a first embodiment of the present invention.

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification.

Further, in the described embodiments, elements having the same component are generally denoted by the same reference numerals and will be described representatively in a first embodiment, and only components different from those of the first embodiment will be described in the other embodiments.

Furthermore, as the size and thickness of the respective structural components shown in the drawings are arbitrarily illustrated for explanatory convenience, the present invention is not necessarily limited to the illustrated sizes and thicknesses.

In the drawings, the thickness of layers, films, panels, regions, etc., may be exaggerated for clarity. In the drawings, for understanding and ease of description, the thicknesses of some layers and areas may be exaggerated.

In addition, unless explicitly described to the contrary, the word "comprise" and variations such as "comprises" or "comprising", will be understood to imply the inclusion of stated elements but not the exclusion of any other elements.

A method of printing an organic light emitting layer on a substrate by discharging an organic light emitting liquid for an organic light emitting layer on the substrate, using a nozzle, has recently been developed.

However, when the organic light emitting layer is printed on the substrate using the nozzle, the organic light emitting liquid is discharged on the substrate while the nozzle moves across a display area of the substrate, and thus the organic light emitting layer is printed in a non-display area of the substrate as well as the display area of the substrate. Therefore, the organic light emitting layer formed in the non-display area needs to be removed by using additional processes.

Hereinafter, a printing apparatus according to a first embodiment of the present invention will be described with reference to FIG. 1.

FIG. 1 shows an apparatus for printing an organic light emitting layer according to a first embodiment of the present invention.

As shown in FIG. 1, an apparatus 1000 for printing an organic light emitting layer according to a first embodiment of the present invention is configured to form an organic light emitting layer in a display area DA of a substrate SUB having the display area DA and a non-display area NDA surrounding the display area DA, and includes a nozzle 100 and a printing mask 200.

The nozzle 100 is disposed above the substrate SUB. The nozzle 100 discharges an organic light emitting liquid OLF for the organic light emitting layer onto the substrate SUB while moving in a moving direction (X) across a mask open part 210 of the printing mask 200. The organic light emitting liquid OLF discharged from the nozzle 100 is masked by the printing mask 200, and then discharged into only the display area DA of the substrate SUB.

The printing mask 200 is disposed between the substrate SUB and the nozzle 100. The printing mask 200 includes the mask open part 210 and a mask cover part 220.

The mask open part 210 is perforated, and exposes the display area DA correspondingly to the display area DA of the substrate SUB. The mask open part 210 may have a hole shape, which is perforated in various shapes correspondingly to the display area DA of the substrate SUB.

The mask cover part 220 surrounds the mask open part 210 and covers the non-display area NDA of the substrate SUB. Since the mask cover part 220 covers the non-display area NDA of the substrate SUB, the organic light emitting liquid OLF discharged from the nozzle 100 moving in the moving direction (X) is discharged onto the mask cover part 220 but not the non-display area NDA of the substrate SUB.

As described above, the apparatus 1000 for printing an organic light emitting layer according to the first embodiment includes the printing mask 200, which is disposed between the nozzle 100 and the substrate SUB and has the mask open part 210 exposing the display area DA of the substrate SUB and the mask cover part 220 covering the non-display area NDA of the substrate SUB, so that, even though the organic light emitting liquid OLF for the organic light emitting layer is discharged onto the substrate SUB by using the nozzle 100, the organic light emitting liquid OLF is not discharged into the non-display area NDA of the substrate SUB since the organic light emitting liquid OLF discharged from the nozzle 100 is discharged to the mask cover part 220 of the printing mask 200.

As such, since the organic light emitting liquid OLF is not discharged into the non-display area NDA of the substrate SUB, there is no need to use additional processes to remove the organic light emitting layer formed in the non-display area NDA of the substrate SUB. This acts as a factor reducing the overall manufacturing cost and manufacturing time of the overall organic light emitting diode (OLED) display.

In addition, the apparatus 1000 for printing an organic light emitting layer according to the first embodiment includes the printing mask 200, so that there is no need to use additional processes to remove the organic light emitting layer formed in the non-display area NDA of the substrate SUB, thereby preventing damage to the organic light emitting layer formed in the display area DA of the substrate SUB due to the process of removing the organic light emitting layer formed in the non-display area NDA of the substrate SUB and preventing damage to a wire or an insulating layer formed in the non-display area NDA of the substrate SUB. This acts as a factor improving reliability in manufacturing the overall organic light emitting diode (OLED) display.

Hereinafter, a printing mask according to a second embodiment of the present invention will be described with reference to FIG. 2.

Hereinafter, only parts distinguished from those of the first embodiment will be described and parts of which descriptions are omitted conform to the first embodiment. Further, like elements of the second embodiment of the present invention will be described by using like reference numerals of the first embodiment, for convenience of illustration.

Figure 2:
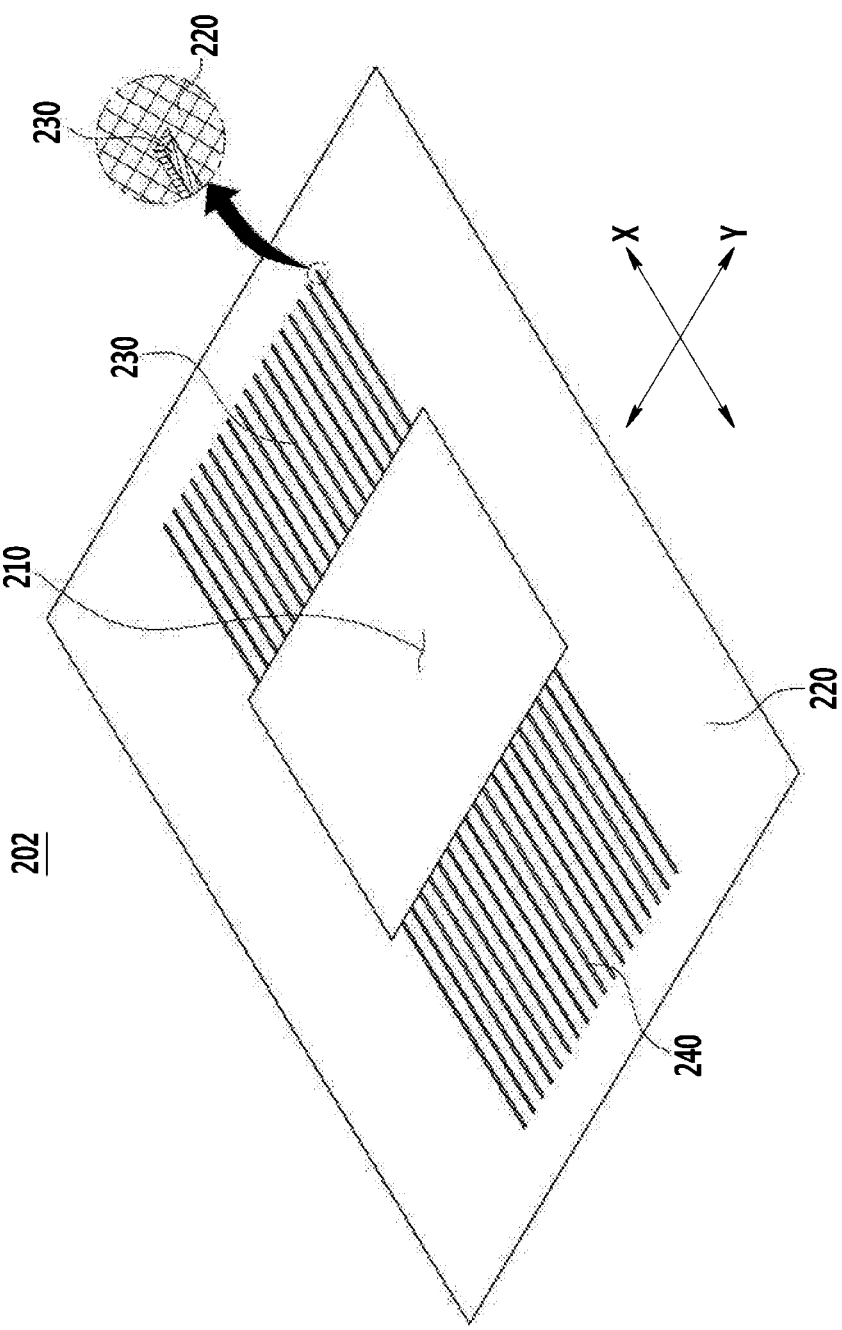
FIG. 2 shows a printing mask according to a second embodiment of the present invention.

FIG. 2 shows a printing mask according to a second embodiment of the present invention.

As shown in FIG. 2, a printing mask 202 according to a second embodiment of the present invention includes a mask open part 210, a mask cover part 220, a first groove 230, and a second groove 240.

The first groove 230 is dented from a surface of the mask cover part 220 adjacently to the mask open part 210. The first groove 230 is disposed at one side of the mask cover part 220 on a path in the moving direction (X) of a nozzle. The first groove 230 is dented from the surface of the mask cover part 220 and extended along the moving direction (X)

of the nozzle. The first groove 230 is plural in number, and the plural first grooves 230 are spaced apart from each other in a crossing direction across the moving direction (X).

The second groove 240 is dented from a surface of the mask cover part 220 adjacently to the mask open part 210. The second groove 240 is disposed at the other side of the mask cover part 220, which is spaced apart from one side of the mask cover part 220 with the mask open part 210 therebetween on a path in the moving direction (X) of the nozzle. The second groove 240 is dented from the surface of the mask cover part 220 and extended along the moving direction (X) of the nozzle. The second groove 240 is plural in number, and the plural second grooves 240 are spaced apart from each other in the crossing direction across the moving direction (X).

The first groove 230 and the second groove 240 may be formed by using a half-etching method or the like employing a photolithographic process or the like.

As such, the printing mask 202 according to the second embodiment of the present invention includes the first groove 230 and the second groove 240, each of the first groove 230 and the second groove 240 functioning as a ditch, so that the organic light emitting liquid discharged onto the mask cover part 220 from the nozzle moves to the first groove 230 and the second groove 240, which have a lower potential energy than the surface of the mask cover part 220, thereby inhibiting the organic light emitting liquid discharged from the nozzle from being located on the surface of the mask cover part 220.

As such, the printing mask 202 according to the second embodiment inhibits the organic light emitting liquid discharged from the nozzle from being located on the surface of the mask cover part 220, so that, at the time of an organic light emitting layer printing process using the printing mask 202, the printing mask 202 can be used as a mask for a long time and inhibit the organic light emitting liquid discharged from the nozzle from being located on the surface of the mask cover part 220 as a drop and thus inhibit the drop formed of the organic light emitting liquid from interfering the nozzle, which moves in the moving direction (X). This acts as both a factor reducing the manufacturing cost and the manufacturing time of the overall organic light emitting diode (OLED) display and a factor improving reliability in manufacturing the organic light emitting diode (OLED) display.

Hereinafter, a printing mask according to a third embodiment of the present invention will be described with reference to FIG. 3.

Hereinafter, only parts distinguished from those of the second embodiment will be described and parts of which descriptions are omitted conform to the second embodiment. Further, like elements of the third embodiment of the present invention will be described by using like reference numerals of the second embodiment, for convenience of illustration.

FIG. 3 shows a printing mask according to a third embodiment of the present invention.

As shown in FIG. 3, a printing mask 203 according to a third embodiment of the present invention includes a mask open part 210, a mask cover part 220, first grooves 230, second grooves 240, a first reservoir 250, and a second reservoir 260.

The first reservoir 250 communicates with a plurality of first grooves 230, and is dented from the surface of the mask cover part 220 and extended in a crossing direction (Y) across a moving direction (X) of a nozzle. The first reservoir 250 is extended in the crossing direction (Y) while having a wider width than the first groove 230. The first reservoir 250 is located between the first grooves 230 and an end portion of the mask cover part 220, an edge of the printing mask 203. The first reservoir 250 may be dented deeper from the surface of the mask cover part 220 as compared with the first groove 230. In addition, a bottom portion of the first groove 230 may be further inclined toward the first reservoir 250.

The second reservoir 260 communicates with a plurality of second grooves 240, and is dented from the surface of the mask cover part 220 and extended in the crossing direction (Y) across the moving direction (X) of the nozzle. The second reservoir 260 is extended in the crossing direction (Y) while having a wider width than the second groove 240. The second reservoir 260 is located between the second grooves 240 and an end portion of the mask cover part 220, an edge of the printing mask 203. The second reservoir 260 may be dented deeper from the surface of the mask cover part 220 as compared with the second groove 240. In addition, a bottom portion of the second groove 240 may be further inclined toward the second reservoir 260.

The first reservoir 250 and the second reservoir 260 may be simultaneously formed by using a half-etching method or the like employing a photolithographic process or the like.

As such, the printing mask 203 according to the third embodiment of the present invention includes the first grooves 230, the second grooves 240, the first reservoir 250, and the second reservoir 260 while the first groove 230 and the second groove 240 each function as a ditch and the first reservoir 250 and the second reservoir 260 each function as a reservoir connected to the ditch. Therefore, the organic light emitting liquid discharged from the nozzle onto the mask cover part 220 moves to the first reservoir 250 and the second reservoir 260 through the first grooves 230 and the second grooves 240, which have a lower potential energy than the surface of the mask cover part 220, respectively, thereby inhibiting the organic light emitting liquid discharged from the nozzle from being located on the surface of the mask cover part 220.

As such, the printing mask 203 according to the third embodiment inhibits the organic light emitting liquid discharged from the nozzle from being located on the surface of the mask cover part 220, so that, at the time of an organic light emitting layer printing process using the printing mask 203, the printing mask 203 can be used as a mask for a longer time as compared with the printing mask 202 according to the foregoing second embodiment and inhibit the organic light emitting liquid discharged from the nozzle from being located on the surface of the mask cover part 220 as a drop and thus inhibit the drop formed of the organic light emitting liquid from interfering the nozzle, which moves in the moving direction (X). This acts as both a factor reducing the manufacturing cost and the manufacturing time of the overall organic light emitting diode (OLED) display and a factor improving reliability in manufacturing the organic light emitting diode (OLED) display.

Hereinafter, a printing mask according to a fourth embodiment of the present invention will be described with reference to FIG. 4.

Hereinafter, only parts distinguished from those of the second embodiment will be described and parts of which descriptions are omitted conform to the second embodiment. Further, like elements of the fourth embodiment of the present invention will be described by using like reference numerals of the second embodiment, for convenience of illustration.

FIG. 4 shows a printing mask according to a fourth embodiment of the present invention.

As shown in FIG. 4, a printing mask 204 according to a fourth embodiment of the present invention includes a mask open part 210, a mask cover part 220, first grooves 230, second grooves 240, a first reservoir 250, and a second reservoir 260.

The first reservoir 250 communicates with a plurality of first grooves 230, and is dented from the surface of the mask cover part 220 and extended in a crossing direction across a moving direction (X) of a nozzle. The first reservoir 250 is extended in a crossing direction (Y) across the moving direction (X) of the nozzle while having a wider width than the first groove 230. The first reservoir 250 is located between the first grooves 230 and the mask open part 210. The first reservoir 250 may be dented deeper from the surface of the mask cover part 220 as compared with the first groove 230. In addition, a bottom portion of the first groove 230 may slop toward the first reservoir 250.

The second reservoir 260 communicates with a plurality of second grooves 240, and is dented from the surface of the mask cover part 220 and extended in the crossing direction (Y) across the moving direction (X) of the nozzle. The second reservoir 260 is extended in the crossing direction (Y) while having a wider width than the second groove 240. The second reservoir 260 is located between the second grooves 260 and the mask open part 210. The second reservoir 260 may be dented deeper from the surface of the mask cover part 220 as compared with the second groove 240. In addition, a bottom portion of the second groove 240 may be further inclined toward the second reservoir 260.

The first reservoir 250 and the second reservoir 260 may be simultaneously formed by using a half-etching method or the like employing a photolithographic process or the like.

As such, the printing mask 204 according to the fourth embodiment of the present invention includes the first grooves 230, the second grooves 240, the first reservoir 250, and the second reservoir 260 while the first groove 230 and the second grooves 240 each function as a ditch and the first reservoir 250 and the second reservoir 260 each function as a reservoir connected to the ditch. Therefore, the organic light emitting liquid discharged from the nozzle onto the mask cover part 220 moves to the first reservoir 250 and the second reservoir 260 through the first groove 230 and the second groove 240, which have a lower potential energy than the surface of the mask cover part 220, respectively, thereby inhibiting the organic light emitting liquid discharged from the nozzle from being located on the surface of the mask cover part 220.

As such, the printing mask 204 according to the fourth embodiment inhibits the organic light emitting liquid discharged from the nozzle from being located on the surface of the mask cover part 220, so that, at the time of an organic light emitting layer printing process using the printing mask 204, the printing mask 204 can be used as a mask for a longer time as compared with the printing mask 202 according to the foregoing second embodiment and inhibit the organic light emitting liquid discharged from the nozzle from being located on the surface of the mask cover part 220 as a drop and thus inhibit the drop formed of the organic light emitting liquid from interfering the nozzle, which moves in the moving direction (X). This acts as both a factor reducing the manufacturing cost and the manufacturing time of the overall organic light emitting diode (OLED) display and a factor improving reliability in manufacturing the organic light emitting diode (OLED) display.

Further, as for the printing mask 204 according to the fourth embodiment of the present invention, each of the first reservoir 250 and the second reservoir 260 dented from the mask cover part 220 is adjacent to the mask open part 210, so that, when the organic light emitting liquid discharged from the nozzle is dropped into the display area of the substrate through the mask open part 210 while passing through the bottom portion of each of the first reservoir 250 and the second reservoir 260, the distance between the bottom portion of each of the first reservoir and the second reservoir 260 and a surface of the display area of the substrate is minimized, resulting in minimizing the falling of the organic light emitting liquid dropped to the substrate through the mask open part 210 while passing through each of the first reservoir 250 and the second reservoir 260, thereby inhibiting the organic light emitting liquid from being spattered. This acts as a factor improving reliability in manufacturing the overall organic light emitting diode (OLED) display.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A printing apparatus comprising:
   a mask disposed between a substrate having a display area and a non-display area surrounding the display area, the mask comprising:
   a mask open part exposing the display area, and
   a mask cover part surrounding the mask open part and covering the non-display area; and
   a nozzle discharging an organic light emitting liquid onto the substrate, wherein the nozzle discharges the organic light emitting liquid while moving in a moving direction across the mask open part,
   wherein the mask further comprises:
   a plurality of first grooves located at one side of the mask cover part on a path in the moving direction, being dented from a surface of the mask cover part and extended along the moving direction and being spaced apart from each other in a crossing direction across the moving direction,
   wherein each of the plurality of first grooves is extended from the same mask open part and connected to the same mask open part.

2. The printing apparatus of claim 1, further comprising a first reservoir communicating with the plurality of first grooves, the first reservoir being dented from the surface of the mask cover part and extended along the crossing direction.

3. The printing apparatus of claim 2, wherein the first reservoir is located between the plurality of first grooves and the mask open part.

4. The printing apparatus of claim 1, further comprising at least one second groove located at the other side of the mask cover part, which is spaced apart from one side of the mask cover part with the mask open part therebetween on the path in the moving direction, the at least one second groove being dented from the surface of the mask cover part and extended along the moving direction.

5. The printing apparatus of claim 4, wherein the mask comprises a plurality of second grooves, the plurality of second grooves being spaced apart from each other in a crossing direction across the moving direction.

6. The printing apparatus of claim 5, further comprising a second reservoir communicating with the plurality of second grooves, the second reservoir being dented from the surface of the mask cover part and extended along the crossing direction.

7. The printing apparatus of claim 6, wherein the second reservoir is located between the plurality of second grooves and the mask open part.

* * * * *